United States Patent
Huang et al.

(10) Patent No.: US 10,398,062 B2
(45) Date of Patent: Aug. 27, 2019

(54) HEAT EXCHANGER, MACHINE CABINET USING THE SAME, AND METHOD OF ASSEMBLING HEAT EXCHANGER

(71) Applicant: DELTA ELECTRONICS, INC., Taoyuan (TW)

(72) Inventors: Yen-Wen Huang, Taoyuan (TW); Kuan-Lung Wu, Taoyuan (TW); Shan-Chun Yang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 162 days.

(21) Appl. No.: 15/392,322

(22) Filed: Dec. 28, 2016

(65) Prior Publication Data

US 2017/0295675 A1    Oct. 12, 2017

(30) Foreign Application Priority Data

Apr. 8, 2016    (TW) .............................. 105111147 A

(51) Int. Cl.
*H05K 7/20* (2006.01)
*F28F 9/00* (2006.01)
*F28D 9/00* (2006.01)
*F28D 1/02* (2006.01)
*F28D 21/00* (2006.01)

(52) U.S. Cl.
CPC ......... *H05K 7/20754* (2013.01); *F28D 1/024* (2013.01); *F28D 9/00* (2013.01); *F28F 9/001* (2013.01); *H05K 7/206* (2013.01); *H05K 7/20736* (2013.01); *F28D 2021/0031* (2013.01)

(58) Field of Classification Search
CPC .............. H05K 7/20754; H05K 7/206; H05K 7/20736; F28D 1/024; F28D 2021/0031; F28D 9/00; F28F 9/00; F28F 9/001
See application file for complete search history.

(56) References Cited

U.S. PATENT DOCUMENTS

2007/0169920 A1\* 7/2007 Yang ................... F28D 15/0275
165/104.34
2015/0147951 A1 5/2015 Funada et al.

FOREIGN PATENT DOCUMENTS

| CN | 201947590 U | 8/2011 | |
|---|---|---|---|
| DE | 102008050376 A1 * | 4/2010 | ........... F24F 11/0001 |
| JP | 2014032982 | 2/2014 | |
| JP | 2014157937 | 8/2014 | |

OTHER PUBLICATIONS

Office Action dated Mar. 22, 2017 from corresponding Taiwan application No. 105111147.
Office Action dated Sep. 19, 2017 from corresponding Japan application No. 2017-011896.

\* cited by examiner

*Primary Examiner* — Mukundbhai G Patel
*Assistant Examiner* — Zhengfu J Feng
(74) *Attorney, Agent, or Firm* — Hauptman Ham, LLP

(57) ABSTRACT

A heat exchanger includes a chassis, and a mounting opening and an outer outlet formed at the bottom of the chassis. The cooling core is installed in the chassis and disposed above the mounting opening. The external circulation fan module is installed from the mounting opening into the chassis. The cover covers the mounting opening. External air flows through the cooling core and exchanges heat with the cooling core to simplify the method of mounting the external circulation fan module.

9 Claims, 14 Drawing Sheets

HEAT EXCHANGER, MACHINE CABINET USING THE SAME, AND METHOD OF ASSEMBLING HEAT EXCHANGER

BACKGROUND OF THE INVENTION

Technical Field

The technical field relates to a machine cabinet, more particularly, to a heat exchanger and method of assembling the heat exchanger.

Description of the Related Art

As the rapid development of computer technology and Internet, the computing and processing capability and power of computers, servers, storage devices and network communication equipment become increasingly higher. Particularly in a data center, the aforementioned devices are installed in cabinets and operate continuously for a long time. To prevent the devices in the cabinet from being overheated and cause performance degradation and malfunction, a heat dissipating device such as a heat exchanger is installed to maintain, adjust or reduce the ambient temperature in a machine room.

Most of the heat exchangers used in cabinets of the communication industry come with an external circulation fan module which sucks external cold air into a heat exchanger for the cooling purpose. Generally an external circulation fan module is installed from an opening disposed on an inner side of the heat exchanger and the inner side faces the internal environment of the cabinet. However, water would occur due to heat exchange. Water leakage then occurs from the opening on the inner side of the heat exchanger and cause damage on devices in the cabinet.

In view of the aforementioned problems of the prior art, the disclosure of this disclosure based on years of experience in the related industry to conduct extensive researches and experiments, and finally provided a feasible solution to overcome the problems of the prior art.

SUMMARY OF THE INVENTION

It is a primary objective of this disclosure to provide a machine cabinet and its heat exchanger, wherein the inner side and the outer side of the heat exchanger are isolated completely and prevent water leakage occurred on the inner side.

Another objective of this disclosure is to provide a method of assembling heat exchanger to simplify the mounting components and structure of the external circulation fan module, so as to improve the convenience of the installation.

To achieve the aforementioned and other objectives, this disclosure provides a heat exchanger, and the heat exchanger includes a chassis, a cooling core, an external circulation fan module and a cover plate. The chassis includes a plurality of plates, an accommodating space enclosed by the plates, a mounting opening formed on a bottom side of the accommodating space, and an outer outlet formed on a lateral side of the accommodating space. The cooling core is installed in the accommodating space and disposed above the mounting opening. The external circulation fan module is installed from the mounting opening into the accommodating space and disposed between the outer outlet and the mounting opening. The cover plate is configured to cover the mounting opening and combined with the chassis and has a plurality of openings. Wherein, outside air enters from the openings into the accommodating space and flows through the cooling core and then exchanges heat with the cooling core and flows out from the outer outlet.

To achieve the aforementioned and other objectives, this disclosure provides a machine cabinet including a cabinet and a heat exchanger. An opening is formed on a side of the cabinet, and the heat exchanger is installed onto the opening. The heat exchanger includes a chassis, a cooling core, an external circulation fan module and a cover plate. The chassis includes a plurality of plates, an accommodating space enclosed by the plates, a mounting opening formed on a bottom side of the accommodating space, and an outer outlet formed on a lateral side of the accommodating space. The cooling core is installed in the accommodating space and disposed above the mounting opening. The external circulation fan module is installed from the mounting opening into the accommodating space and disposed between the outer outlet and the mounting opening. The cover plate is configured to cover the mounting opening and combined with the chassis and has a plurality of openings. Wherein, outside air enters from the openings into the accommodating space and flows through the cooling core and then exchanges heat with the cooling core and flows out from the outer outlet.

To achieve the aforementioned and other objectives, this disclosure provides a method of assembling a heat exchanger, include: (1) providing a chassis enclosing an accommodating space and having an inner side facing an internal environment of a cabinet, having an outer side facing an external environment of the cabinet, and having an outer outlet and a mounting opening respectively disposed on the outer side; (2) installing a cooling core installed in the accommodating space and disposed above the mounting opening; (3) installing an external circulation fan module from the mounting opening into the accommodating space and between the outer outlet and the mounting opening; (4) covering the mounting opening by combining the chassis with a cover plate.

Compared with an external circulation fan mounting structure of a conventional heat exchanger having a mounting opening formed on an inner side of a chassis, the mounting opening of this disclosure is arranged at the outer side of the chassis, and the fan frame with the circulation fan is installed from the mounting opening into the chassis, and finally the cover plate is locked to the fan frame, so as to simplify the mounting structure and more importantly to isolate the inner side and the outer side of the heat exchanger completely. Therefore water will not leak from the inner side, and the sealability of the chassis will be improved. In addition, when the external circulation fan module of this disclosure is installed, the cover plate covers the locking element and hides the locking element in the chassis to improve the overall appearance of the heat exchanger of this disclosure.

DESCRIPTION OF THE PREFERRED EMBODIMENTS

The technical contents of this disclosure will become apparent with the detailed description of preferred embodiments accompanied with the illustration of related drawings as follows. It is intended that the embodiments and figures disclosed herein are to be considered illustrative rather than restrictive.

Figure 1:
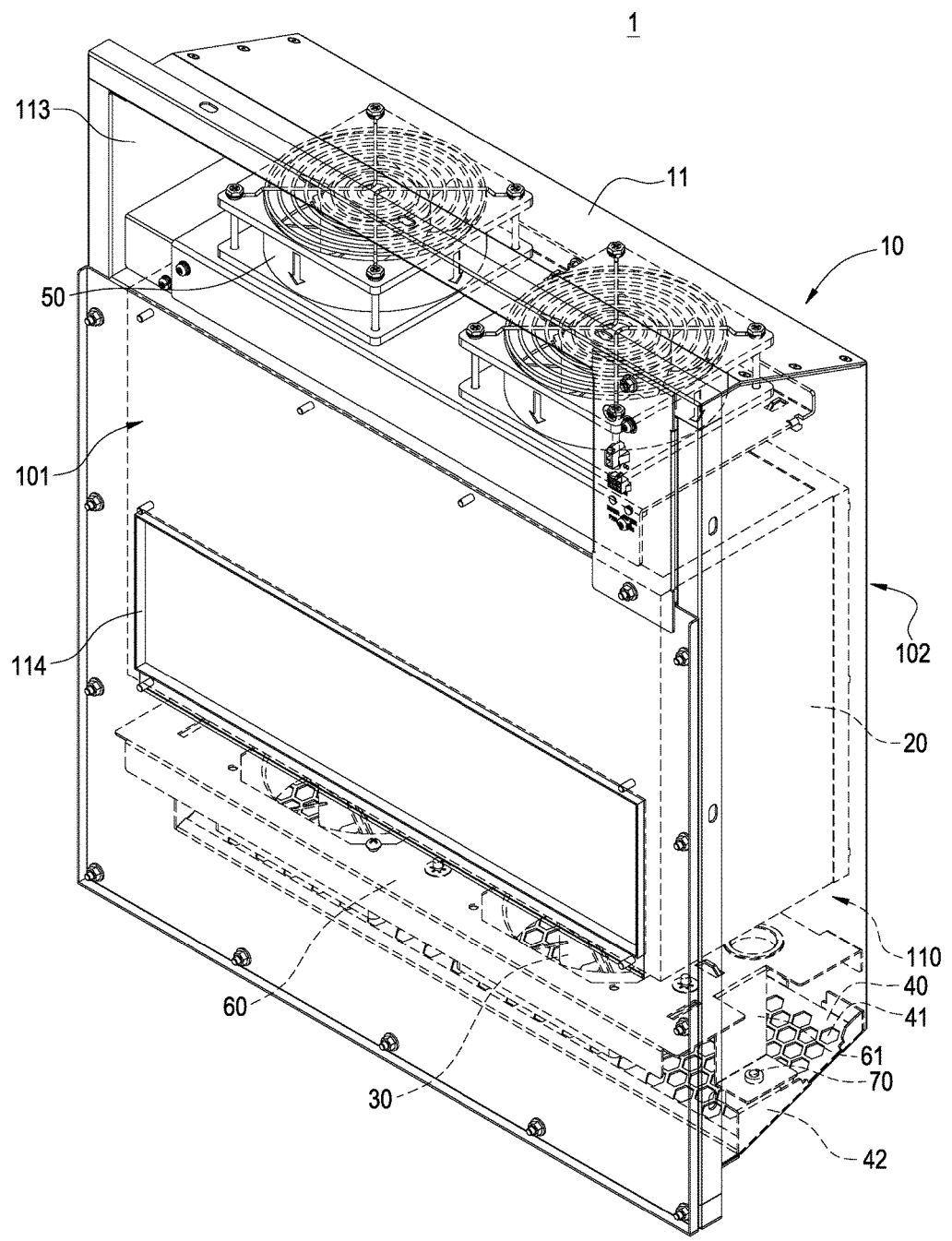
FIG. 1 is a perspective view of a heat exchanger in accordance with one embodiment of this disclosure viewing from a side.
Figure 2:
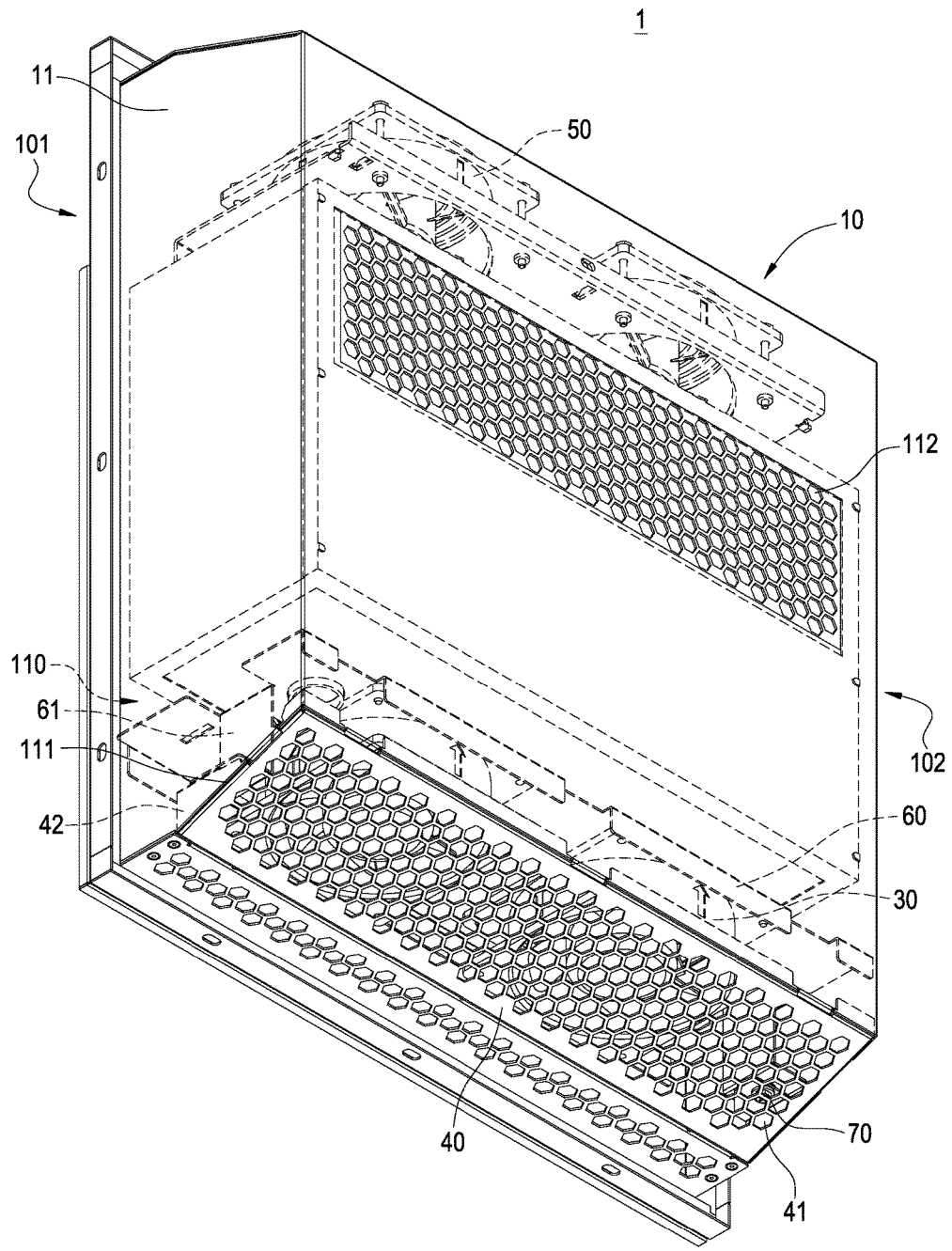
FIG. 2 is a perspective view of a heat exchanger in accordance with one embodiment of this disclosure viewing from another side.
Figure 3:
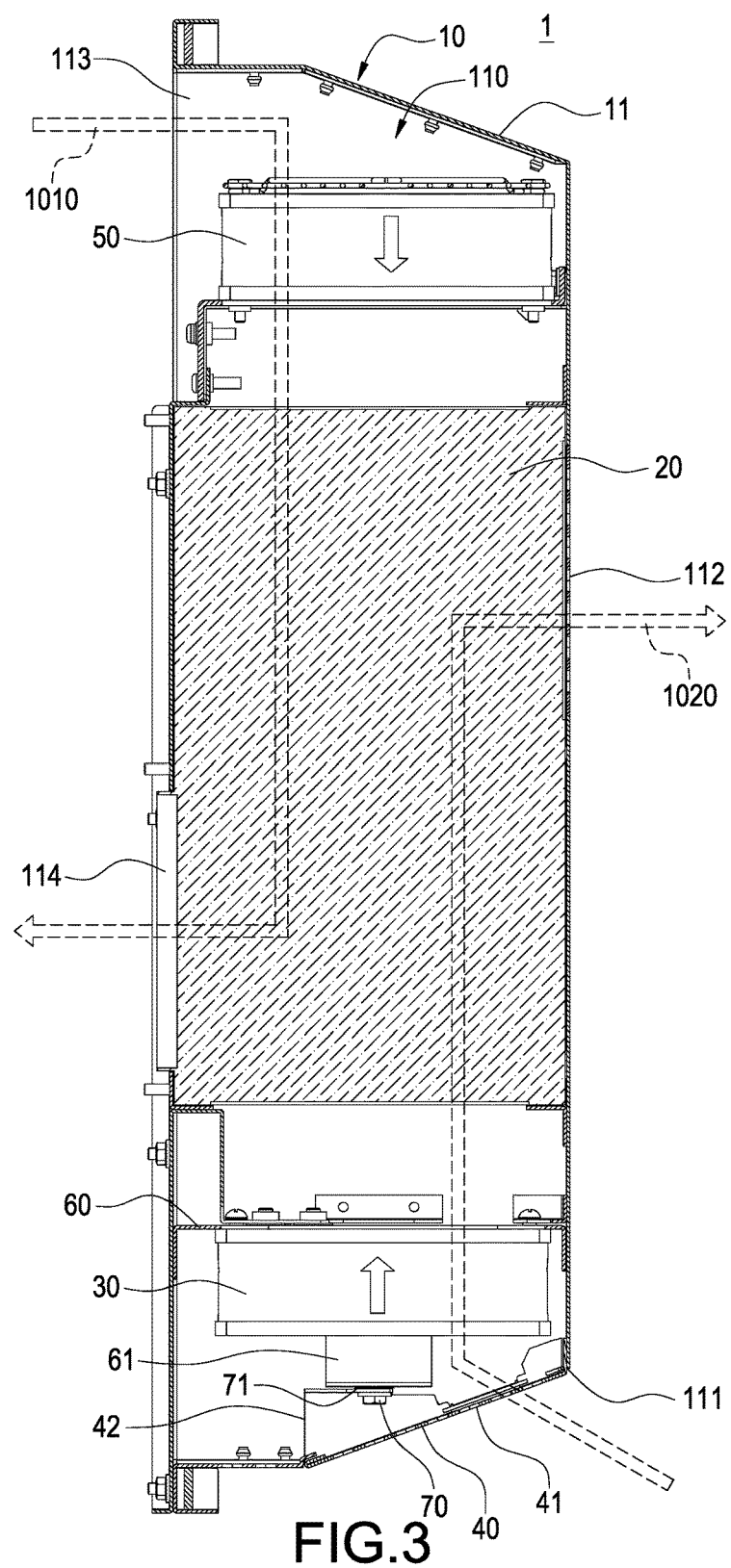
FIG. 3 is a schematic view of airflows in a heat exchanger in accordance with one embodiment of this disclosure.

With reference to FIGS. 1 to 3 for perspective views of a heat exchanger viewing from both sides and a schematic view of airflows in the heat exchanger in accordance with one embodiment of this disclosure respectively, the heat exchanger 1 includes a chassis 10, a cooling core 20, an external circulation fan module 30 and a cover plate 40. The chassis 10 has a mounting opening 111 disposed on a bottom of the chassis 10, and the cooling core 20 and the external circulation fan module 30 are installed in the chassis 10, and the cover plate 40 is configured to cover the mounting opening 111 and combine with the chassis 10.

In FIGS. 1 and 2, the chassis 10 may include a plurality of plates 11 and an accommodating space 110 enclosed by the plates 11. In addition, the mounting opening 111 is disposed on a bottom of the accommodating space 110. The chassis 10 has an outer outlet 112 disposed on a lateral of the accommodating space 110.

In addition, the chassis 10 has an inner side 101 facing an internal environment of a machine cabinet (not shown) and an outer side 102 facing an external environment of the machine cabinet. The chassis 10 has an inner inlet 113 and an inner outlet 114 formed at the inner side 101, and the chassis 10 has the outer outlet 112 and the mounting opening 111 formed at the outer side 102.

The cooling core 20 is a core component of a device such as a heat exchanger or a heat recycle device. The cooling core 20 is provided for passing external cold air and internal hot air for heat exchange and recycle. In an embodiment of this disclosure, the cooling core 20 is installed in the accommodating space 110 and disposed above the mounting opening 111.

It is noteworthy that the external circulation fan module 30 is installed from the mounting opening 111 into the accommodating space 110 and disposed between the outer outlet 112 and the mounting opening 111. The cover plate 40 has a plurality of holes 41 as an outer inlet, and the cover plate 40 fits the mounting opening 111 of the chassis 10. Each hole 41 is a honeycomb hole in an embodiment of this disclosure, but the hole 41 of this disclosure is not limited to the honeycomb hole only.

In this embodiment, the heat exchanger 1 further comprises an internal circulation fan module 50 installed in the chassis 10, configured to be corresponding to the external circulation fan module 30, and disposed in a top of the accommodating space 110. Besides, the cooling core 20 is fixed between the external circulation fan module 30 and the internal circulation fan module 50.

Preferably, the external circulation fan module 30 and the internal circulation fan module 50 include axial fans respectively.

Figure 13:
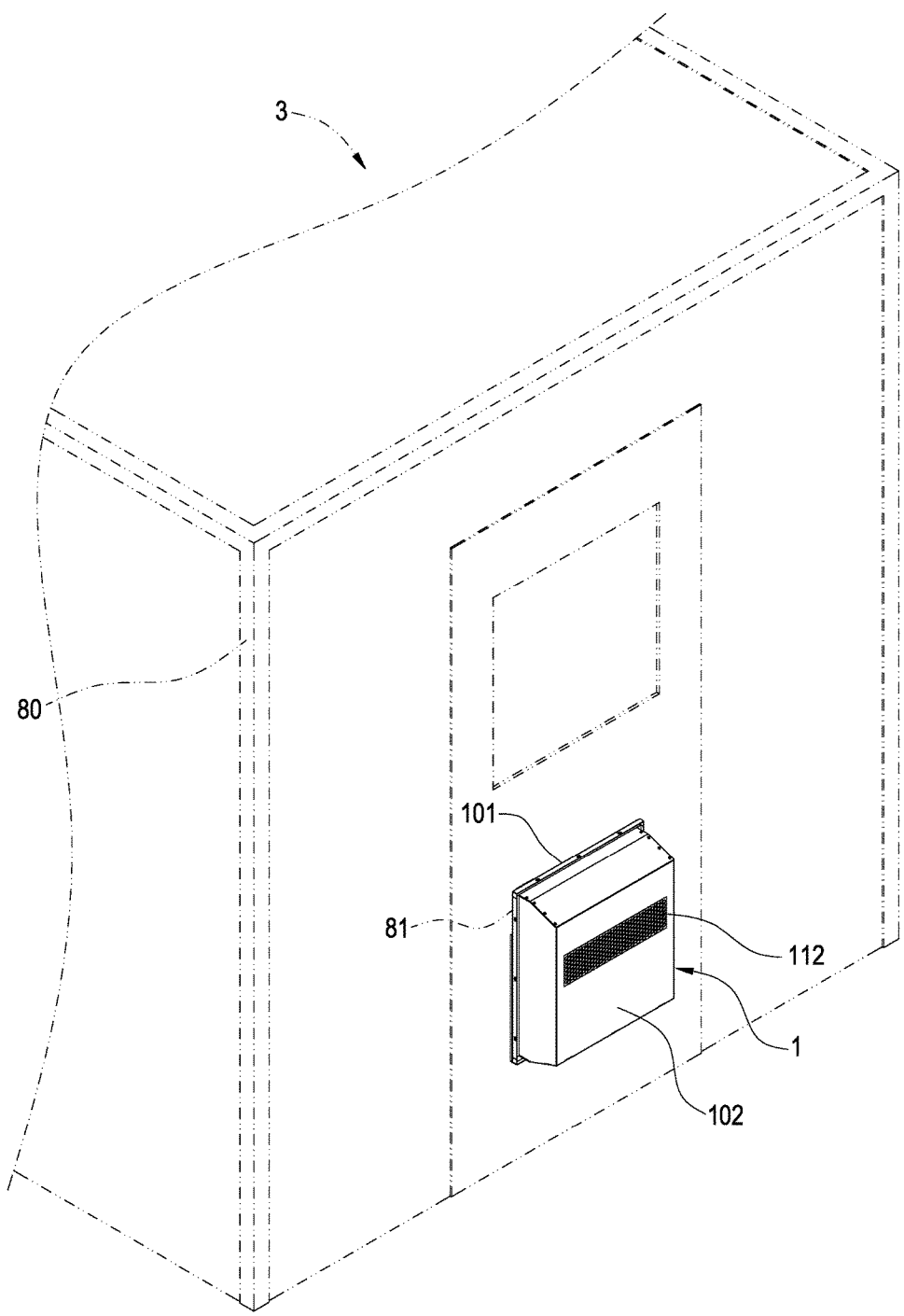
FIG. 13 is a perspective view of a heat exchanger combined with a machine cabinet in accordance with one embodiment of this disclosure.

With reference to FIG. 3 and FIG. 13, the heat exchanger 1 is arranged on a machine cabinet 3 for exchanging heat of the internal environment of the cabinet and external environment of the cabinet. The chassis 10 has an inner side 101 facing the internal environment and an outer side 102 facing the external environment. The inner side 101 of the chassis 10 has an inner inlet 113 and an inner outlet 114, and the outer side 102 of the chassis 10 has an outer outlet 112 and a mounting opening 111. Preferably, the inner inlet 113 is disposed adjacent to the internal circulation fan 50 and the mounting opening 111 is disposed adjacent to the external circulation fan module 30. Moreover, the inner outlet 114 and the outer outlet 112 are disposed at the cooling core 20.

A first air passage (1010) extends from the inner inlet 113 through the internal circulation fan 50 and the cooling core 20 and toward the inner outlet 114; thus, the first air passage 1010 may communicate with the internal environment of the cabinet. A second air passage (1020) extends from the holes 41 disposed within the mounting opening 111 through the external circulation fan module 30 and the cooling core 20 and toward the outer outlet 112; thus, the second air passage 1020 may communicate with the external environment of the cabinet. Besides, the first air passage is disposed at the inner side and the second air passage is disposed at the outer side; thus, the first air passage and the second air passage are completely isolated in the heat exchanger 1.

In the first air passage, after inside air (assumed to be a hot air with a temperature higher than the temperature of the cooling core) is driven by air current of the internal circulation fan 50 to enter from the inner inlet 113 into the accommodating space 110, the inside air passes through the cooling core 20. Next, the heat of the inside air is conducted to the cooling core 20. Finally, the cooled inside air flows out from the inner outlet 114.

In the second air passage, outside air (assumed to be a cold air with a temperature lower than the temperature of the cooling core) is driven by the air current of the external circulation fan module 30 to enter from the holes 41 into the accommodating space 110 and then pass through the cooling core 20. Next, the heat of the cooling core 20 is conducted to the outside air, and finally the heated outside air flows out from the outer outlet 112. As above, the heat of internal environment can be transferred to external environment by the heat exchanger 1. Therefore, the first air passage 1010 and the second air passage 1020 are configured to exchange heat between the internal and the external environment respectively.

Figure 4:
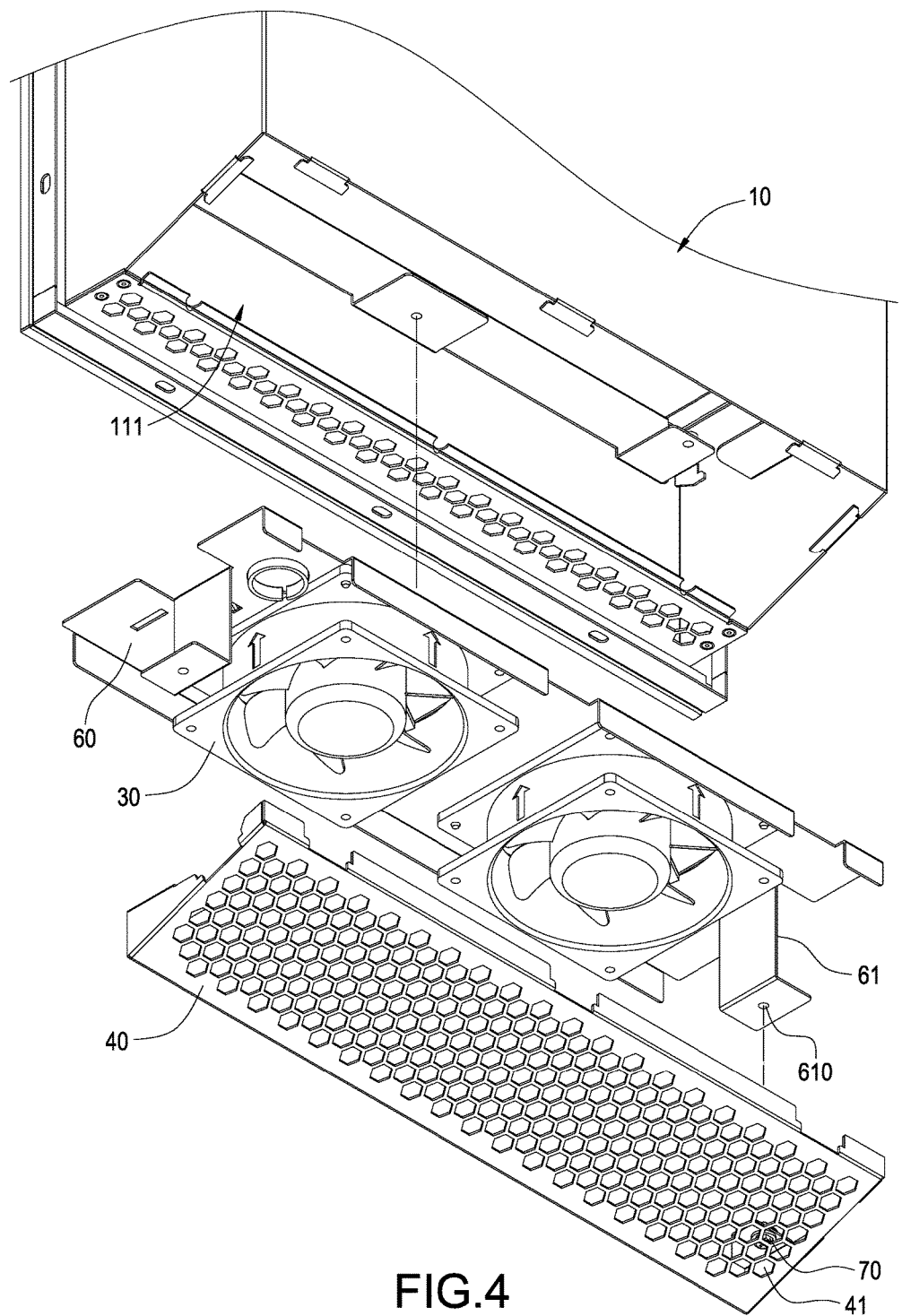
FIG. 4 is an exploded view of a heat exchanger in accordance with one embodiment of this disclosure.

With reference to FIG. 4 for a perspective view of external circulation fan module accordance with one embodiment of this disclosure, the external circulation fan module 30 of this embodiment includes a fan frame 60. After the external circulation fan module 30 is fixed in the chassis 10 by the fan frame 60, the cover plate 40 is locked onto the fan frame 60 to integrate with the chassis 10. Specifically, the fan frame 60 and the cover plate 40 are combined as follows.

Figure 5:
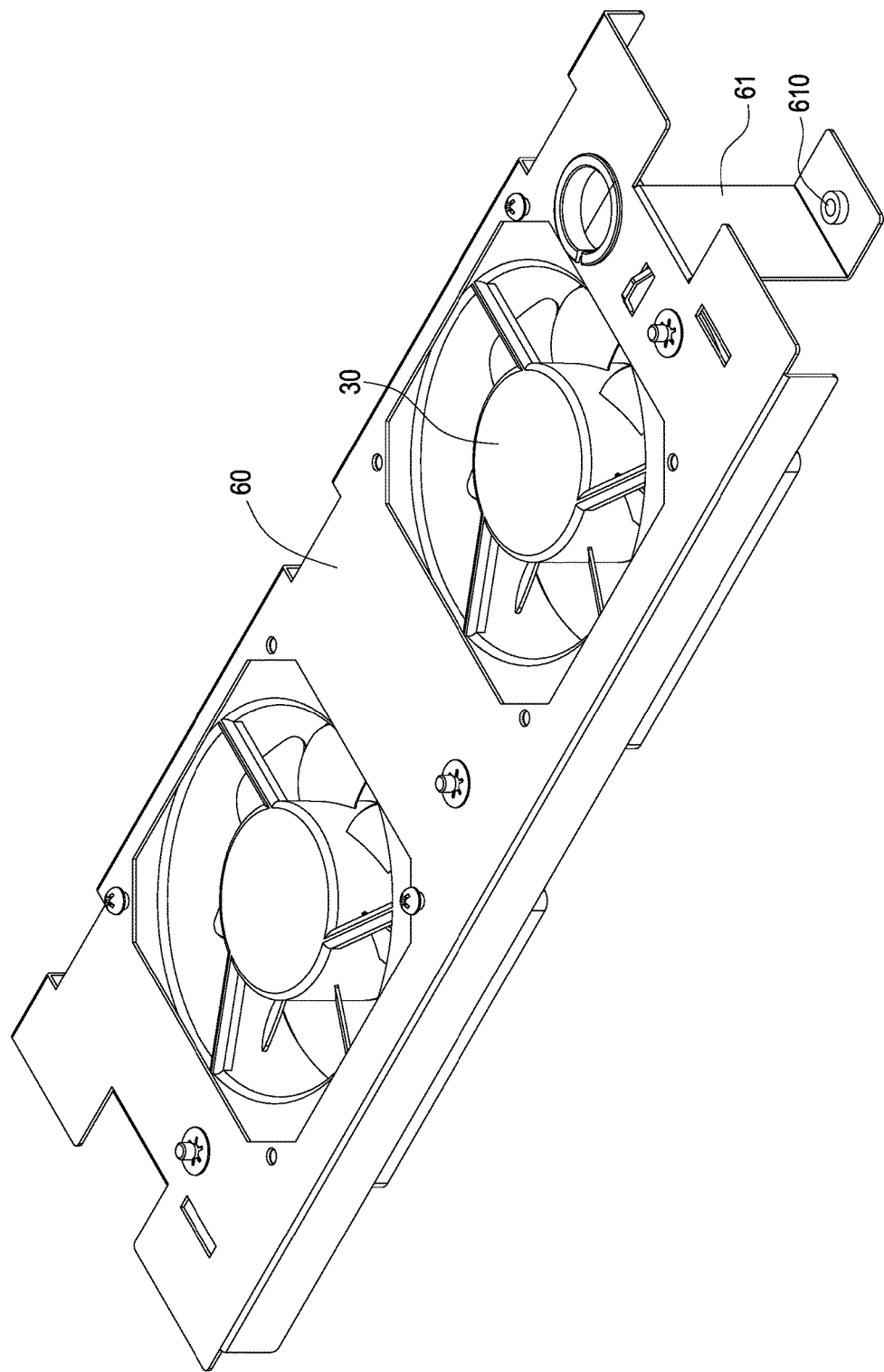
FIG. 5 is a perspective view of an external circulation fan module mounted onto a fan frame in accordance with one embodiment of this disclosure.

With reference to FIG. 5 for a perspective view of an external circulation fan module 30 includes the axial fan and the fan frame in accordance with an embodiment of this disclosure, the fan frame 60 has at least one flap 61. Preferably, the fan frame 60 has a pair of flaps 61 installed on both sides of the fan frame 60 respectively. In addition, each of the pair of flaps 61 is perpendicularly extended from the fan frame 60 towards the cover plate 40. The flap 61 is L-shaped, and a locking hole 610 is configured on a plane which is contacted with the cover plate 40.

Figure 6:
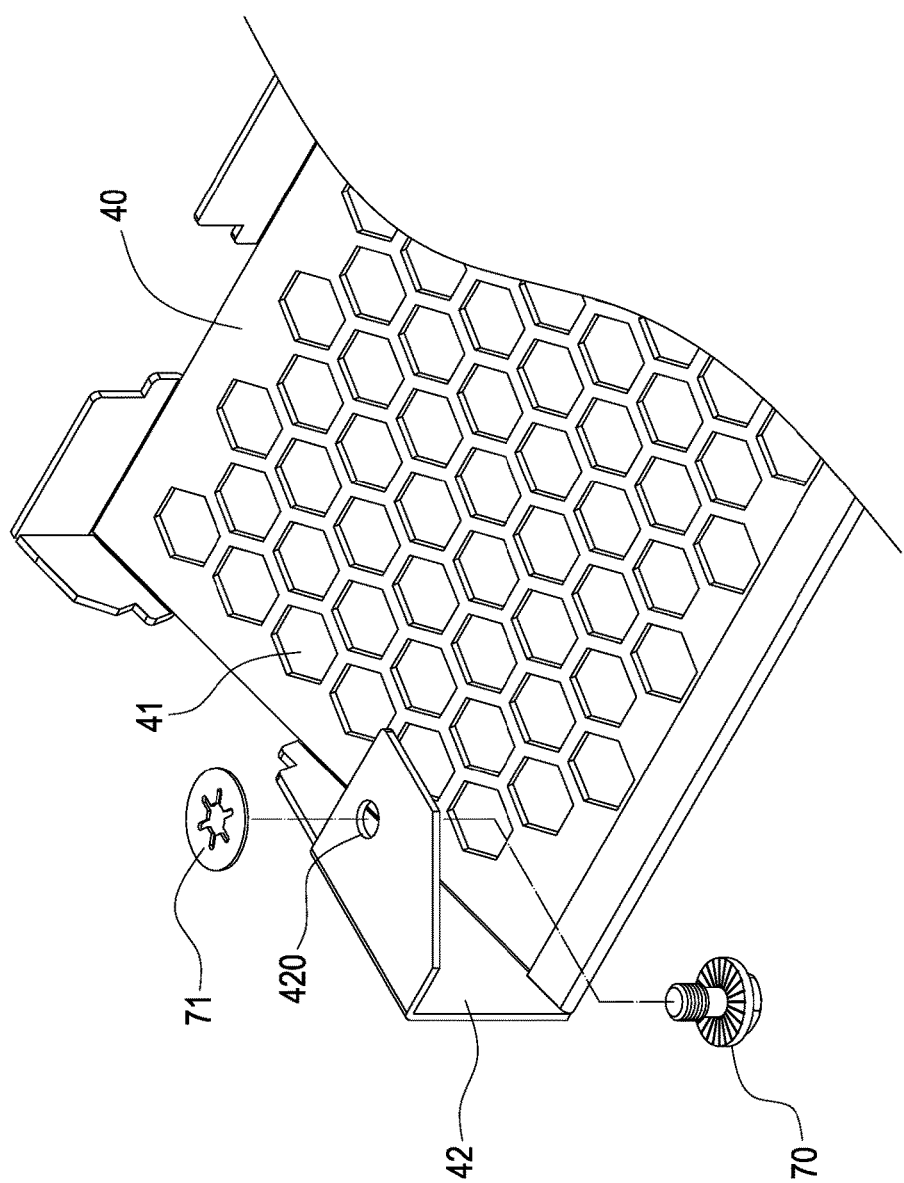
FIG. 6 is a perspective view of a cover plate and a locking element in accordance with one embodiment of this disclosure.
Figure 7:
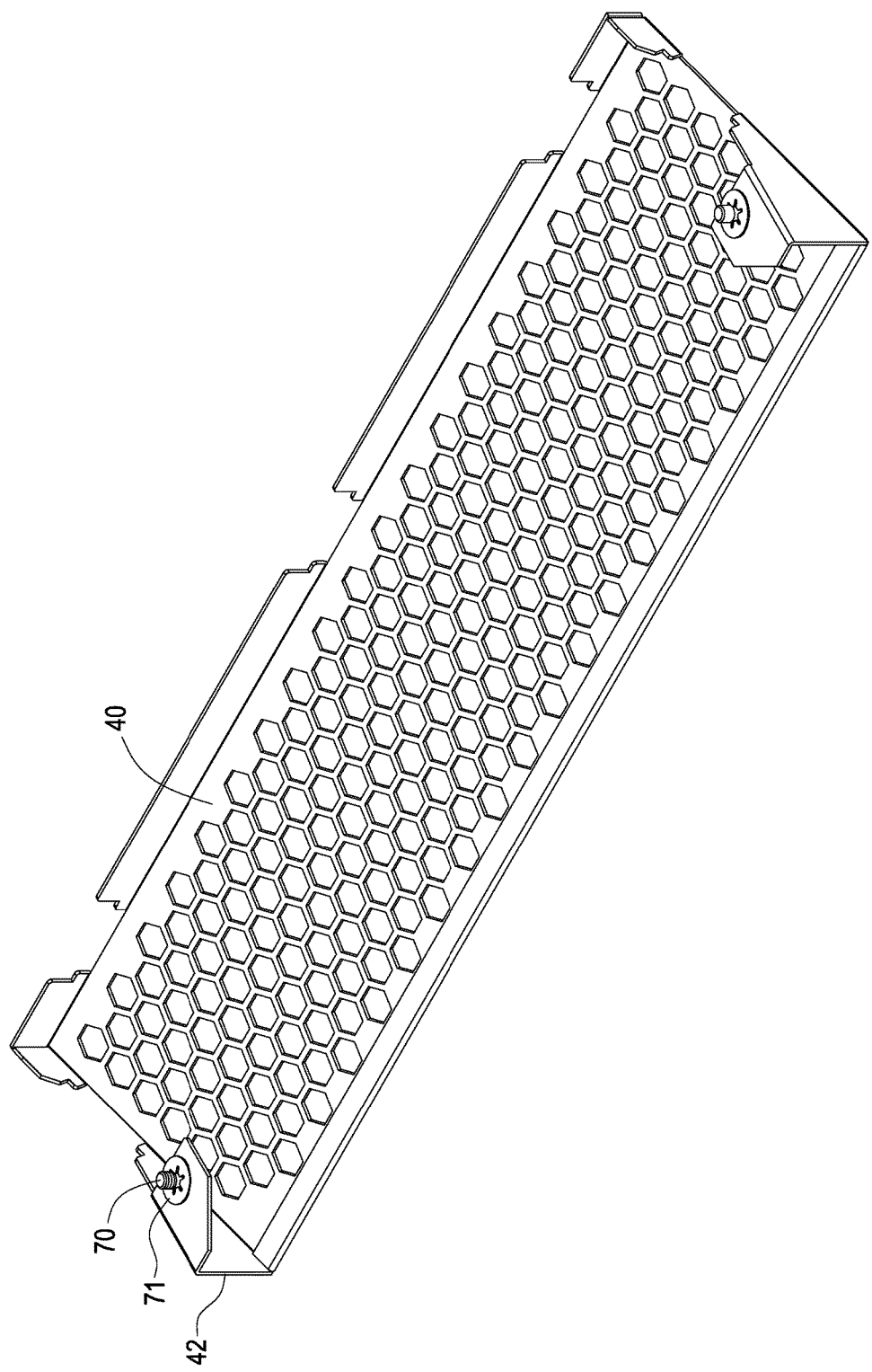
FIG. 7 is a perspective view of a cover plate and locking element combined with each other in accordance with one embodiment of this disclosure.

With reference to FIGS. 6 and 7 for a schematic view of combining a cover plate and a locking element and a perspective view of the combined structure of the cover plate and the locking element respectively, the cover plate 40 of this embodiment as shown in FIG. 6 has a fixing plate 42 configured to be corresponding to the fan frame 60. Preferably, the cover plate 40 has a pair of fixing plates 42 each of the pair of fixing plates 42 has a through hole 420. The fixing plates 42 extends perpendicularly from the cover plate 40 towards the fan frame, and a cross-section of the fixing plates 42 is L-shaped, and the through hole 420 is disposed on a plane which is parallel to the plane of the flap 61. In addition, the heat exchanger 1 of this disclosure further comprises at least one locking element 70 and a gasket 71. Preferably, the heat exchanger 1 comprises a pair of locking elements 70 and a pair of gaskets 71. Each locking element 70 is configured to penetrate into the through hole 420 from a side of the fixing plate 42, and coupled to the gasket 71 on the other side of the fixing plate 42. More specifically, as shown in FIG. 7, each locking element 70, e.g. a captive screw, may be fixed on the fixing plate 42 by penetrating and engaging with the gasket 71.

Figure 8:
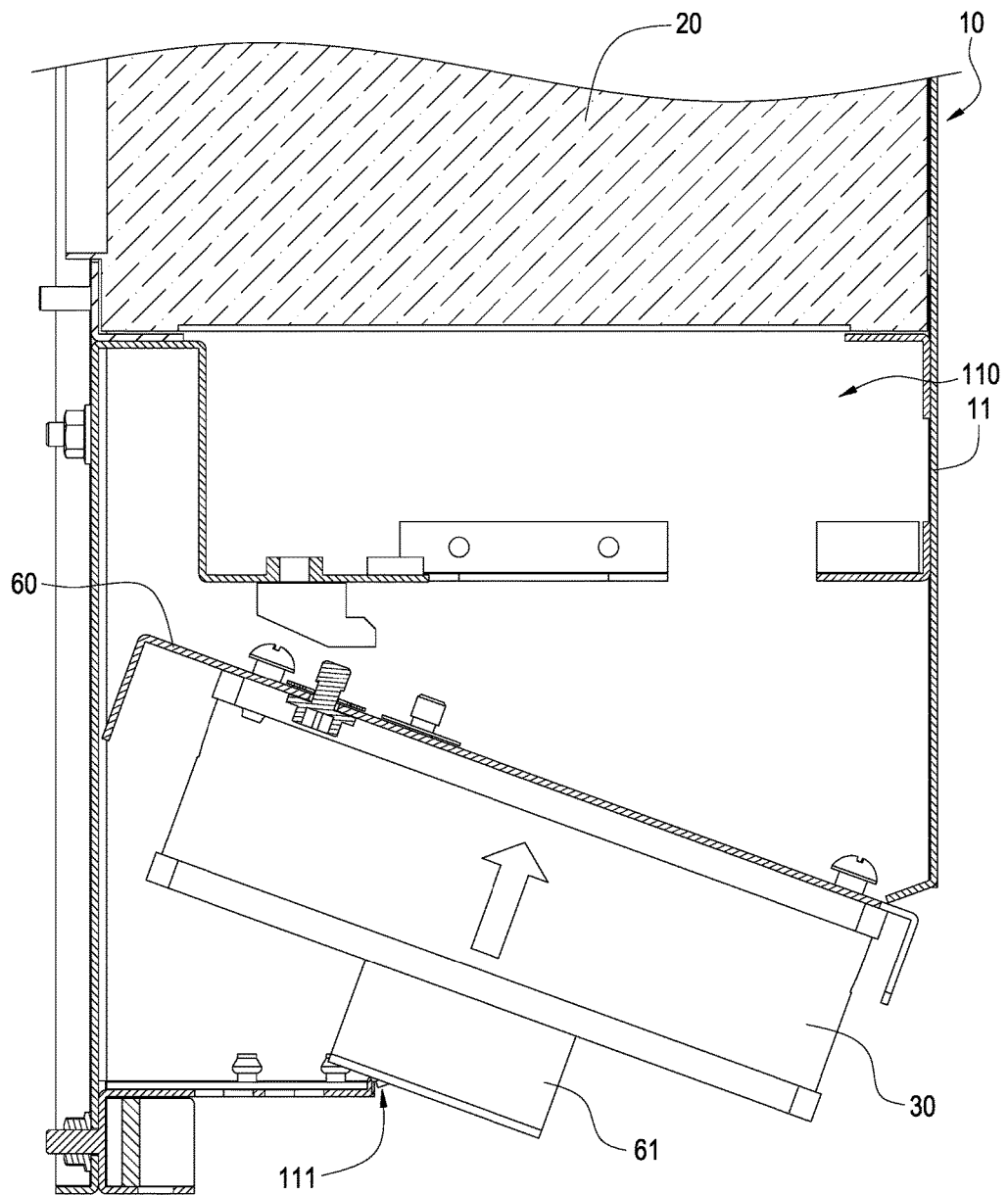
FIG. 8 is a cross-sectional view of installing an external circulation fan module into a chassis in accordance with one embodiment of this disclosure.

With reference to FIG. 8 for a cross-sectional view of installing an external circulation fan module into a chassis in accordance with this disclosure, the axial fan is fixed onto the fan frame 60 and then the external circulation fan module 30 is installed slantingly into the chassis 10 to facilitate the process of fixing the fan frame 60 into the chassis 10.

Figure 9:
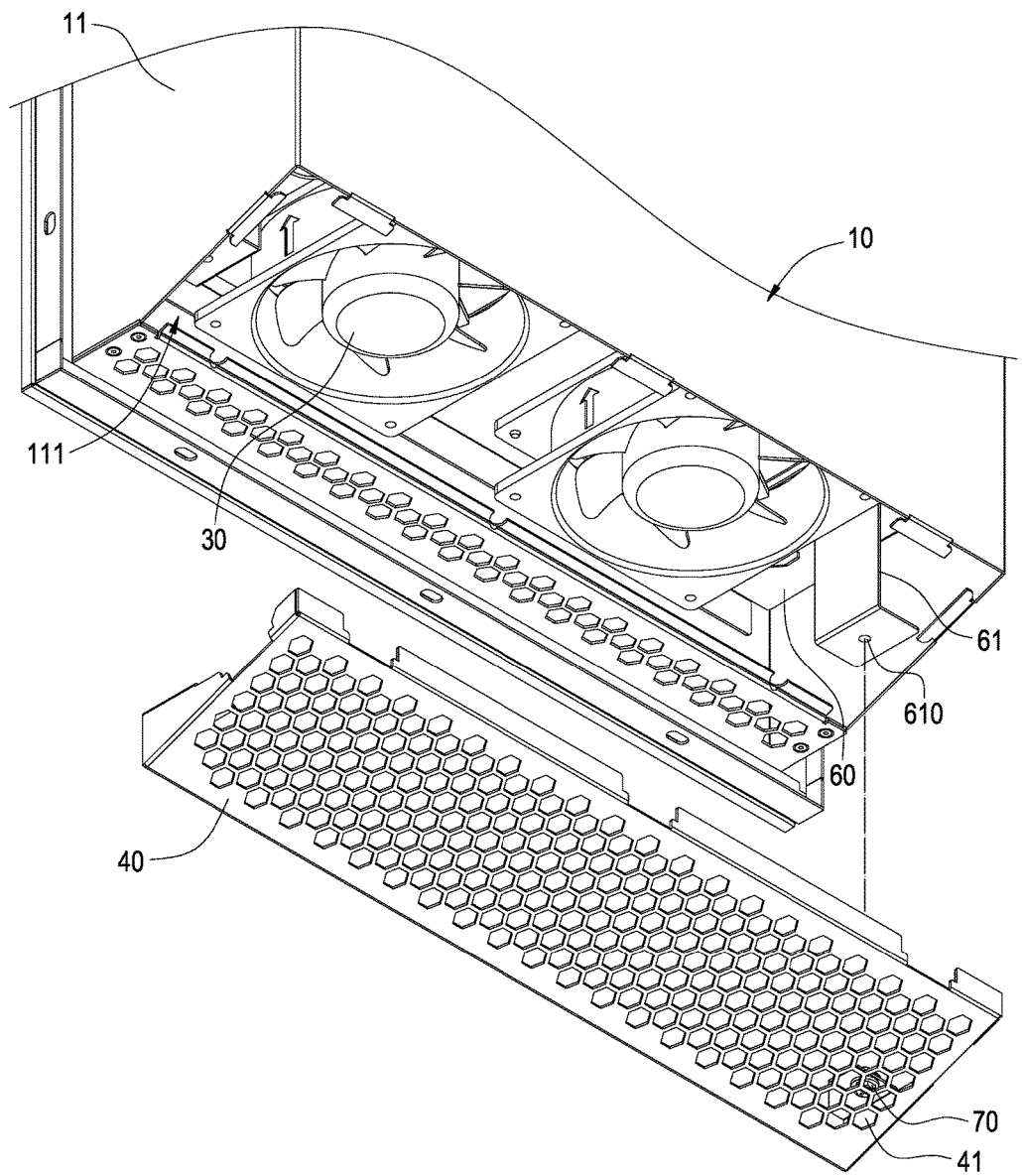
FIG. 9 is a perspective view of combining a cover plate with a chassis in accordance with one embodiment of this disclosure.
Figure 10:
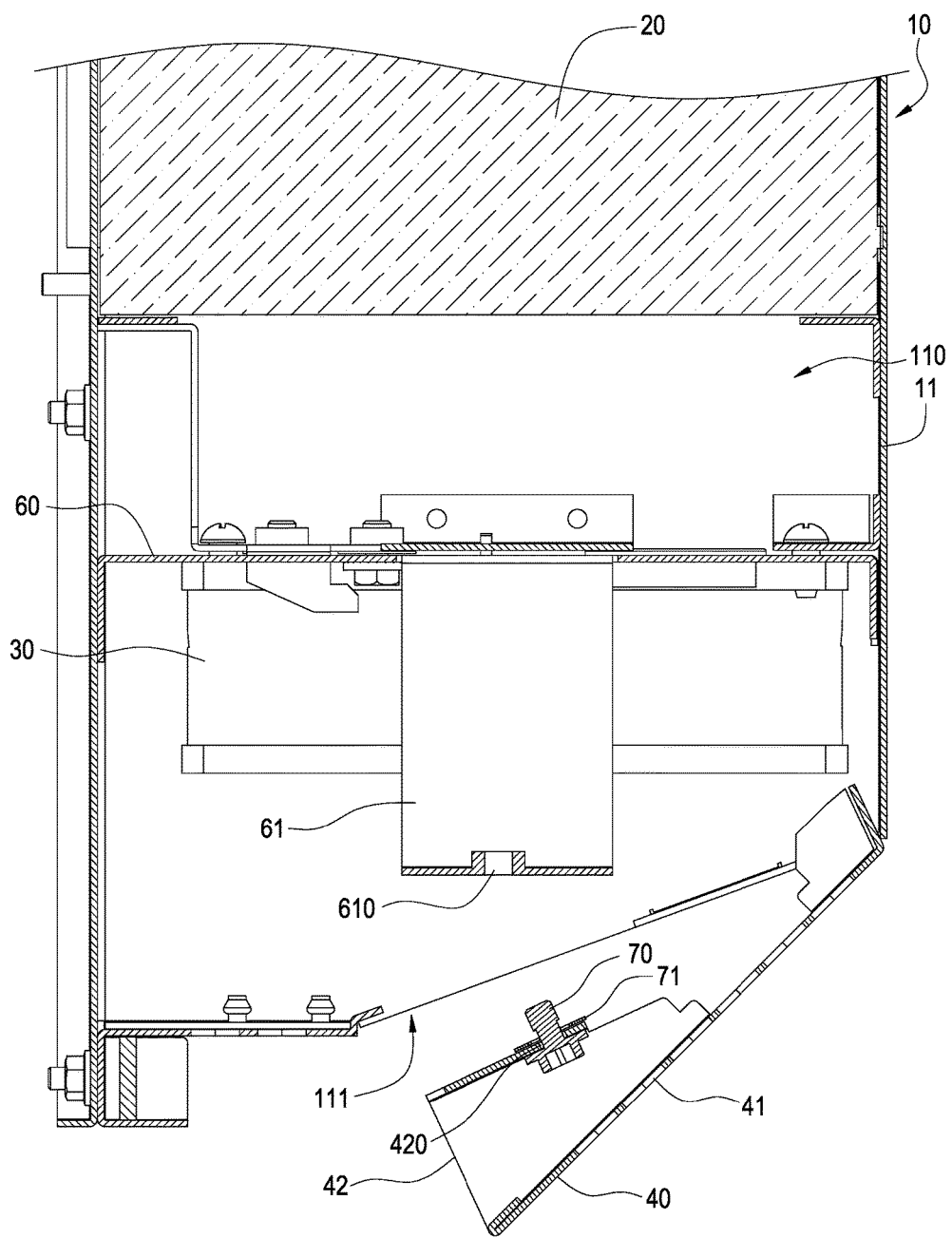
FIG. 10 is a cross-sectional view of combining a cover plate with a chassis in accordance with one embodiment of this disclosure.

With reference to FIGS. 9 and 10 for a perspective view and a cross-sectional view of a cover plate combined with a chassis in accordance with an embodiment of this disclosure respectively, after the fan frame 60 of this embodiment is fixed within the chassis 10, the cover plate 40 covers the mounting opening 111.

With reference to FIG. 10 for combining a cover plate 60 with the chassis 10 in accordance with one embodiment of this disclosure, When the cover plate 40 covers the mounting opening 111, the pair of locking elements 70 combined with the gaskets 71 on the fixing plate 42 are corresponding to the locking holes 610 of the flaps 61 on both sides of the fan frame 60 respectively.

Figure 11:
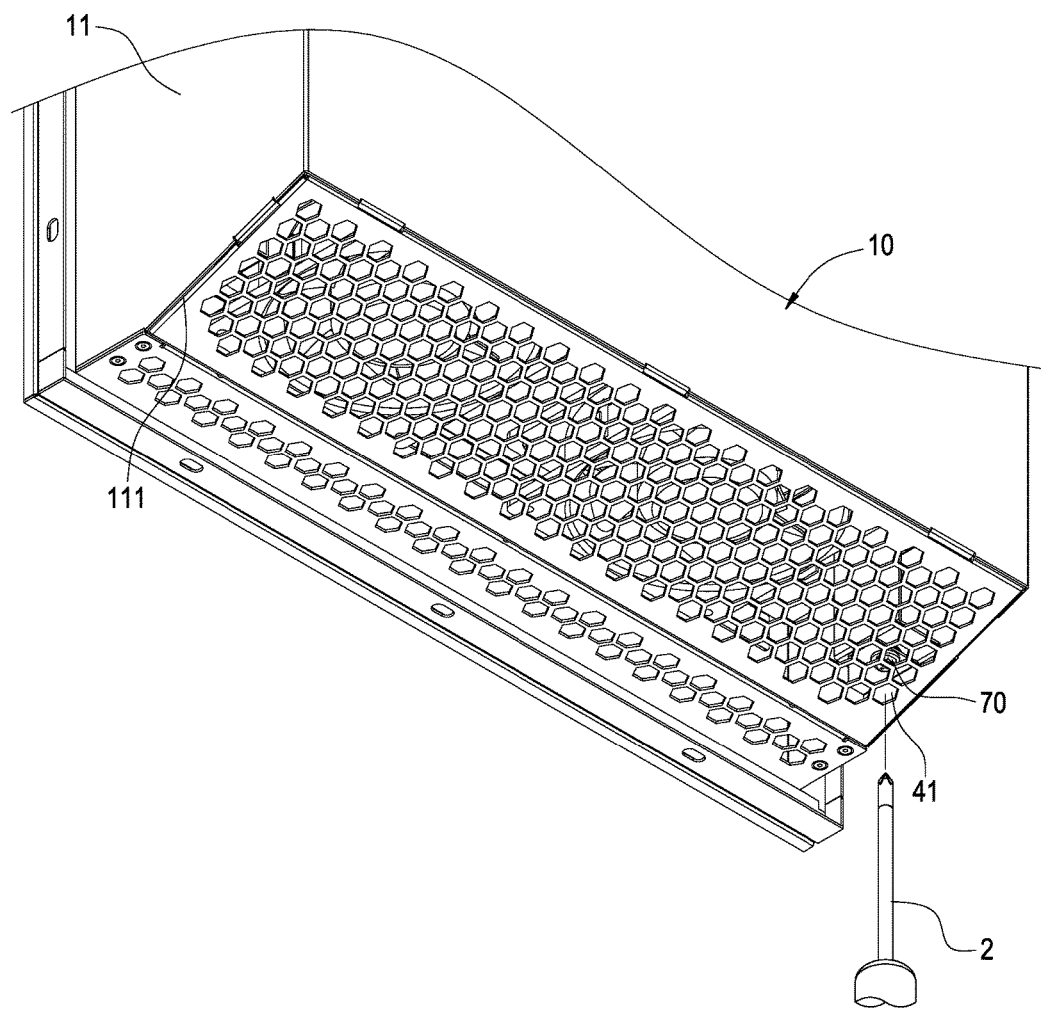
FIG. 11 is a perspective view of a cover plate locked by a hand tool in accordance with one embodiment of this disclosure.
Figure 12:
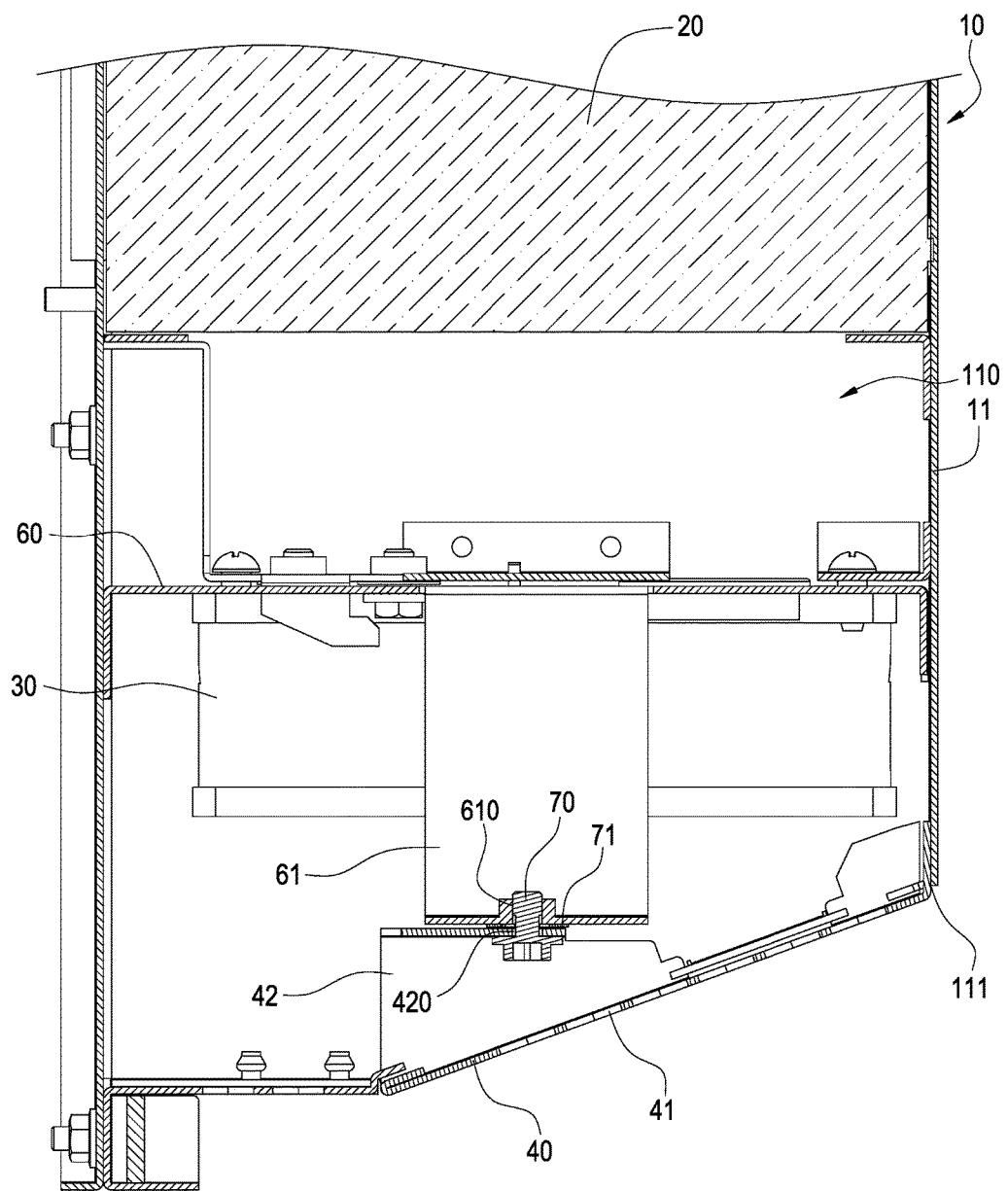
FIG. 12 is a cross-sectional view of a cover plate locked by a hand tool in accordance with one embodiment of this disclosure.

With reference to FIGS. 11 and 12 for schematic views of using a hand tool to lock a cover plate in accordance with one embodiment of this disclosure, a hand tool 2 (such as a screwdriver) as shown in FIG. 11 is provided for locking the cover plate 40. In this embodiment, each hole 41 of the cover plate 40 is allowed to pass a hand tool 2. After being aligned with the locking holes 610, the hand tool 2 is used to pass through one of the holes 41 corresponding to the locking element 70, insert into the head of the locking element 70 and then tighten the locking element 70 with the locking hole 610.

With reference to FIG. 12, after the locking operation, the fixing plate 42 is secured to the flap 61. Thus, the cover plate 40 is locked onto the fan frame 60 to integrate with the chassis 10. In addition, the pair of gaskets 71 is clamped between the flap 61 of the fan frame 60 and the fixing plate 42 of the cover plate 40. It is noteworthy that the installation of the gasket 71 prevents the locking element 70 from being separated from the through hole 420 of the fixing plate 42 and provides a better locking effect between the flap 61 and the fixing plate 42.

Since the external circulation fan module 30 is installed from the mounting opening 111 at outer side 102, no opening of the second air passage 1020 disposed at the inner side 101. Thus, the first air passage 1010 and the second air passage 1020 can be isolated. Therefore water leakage will not occur on the inner side 101, and the sealability of the chassis 10 is improved. In addition, after the external circulation fan module 30 of this disclosure is installed, the cover plate 40 can be locked directly to the fan frame 60 so as to simplify the mounting structure. Further, the locking elements 70 are covered and hidden by the cover plate 40 within the chassis 10 so as to improve the overall appearance of the heat exchanger 1 of this disclosure.

With reference to FIG. 13 for a perspective view of a heat exchanger combined with a machine cabinet in accordance with one embodiment of this disclosure, the heat exchanger 1 is applicable to a machine cabinet 3, e.g. telecommunication cabinet. The machine cabinet 3 comprises a cabinet 80 and the heat exchanger 1. In practical use, an opening 81 is formed on a sidewall of the cabinet 80, and the heat exchanger 1 is installed onto the sidewall of the cabinet 80 and has the inner side 101 corresponding to the opening 81 and facing the interior of the cabinet 80. The outer side 102 of the heat exchanger 1 is exposed from the sidewall of the cabinet 80, so that the outer outlet 112 and the cover plate 40 (not shown in the figure) are protruded from the cabinet 80. Therefore, the heat exchanger 1 can exchange heat of the cabinet 80.

Figure 14:
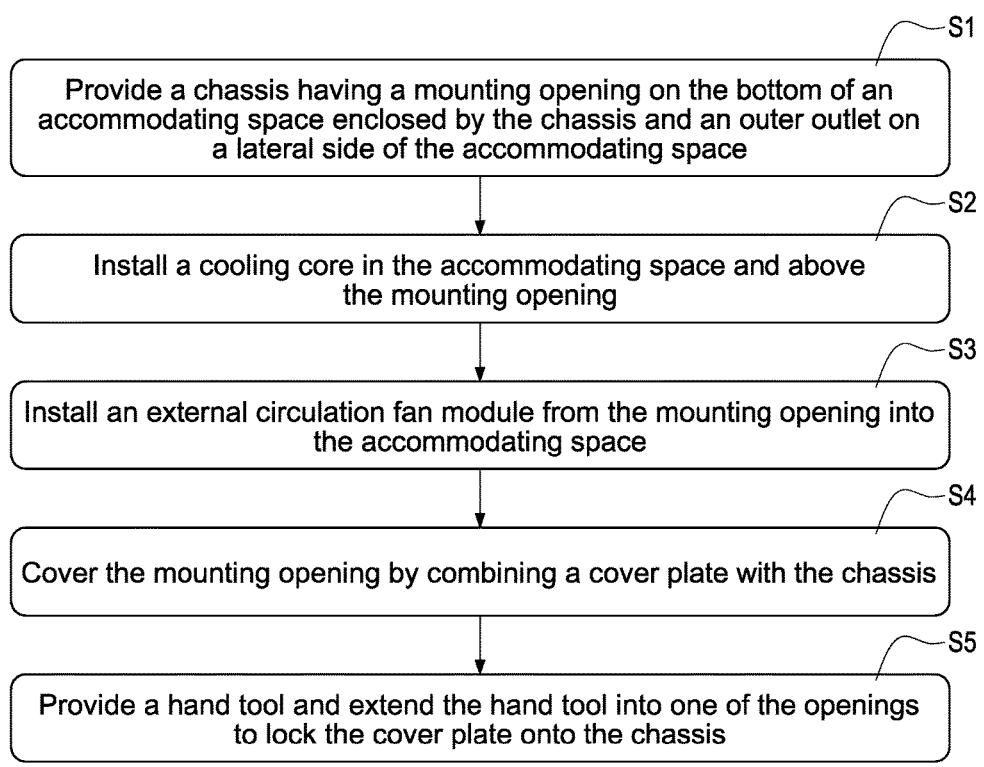
FIG. 14 is a flow chart of a method of assembling a heat exchanger in accordance with one embodiment of this disclosure.

With reference to FIG. 14 for a flow chart of a method of assembling a heat exchanger of this disclosure, the method includes the steps of: (1) providing a chassis 10, wherein the chassis 10 has a mounting opening 111 on a bottom of an accommodating space 110 enclosed by the chassis 10, and has an outer outlet 112 on a lateral of the accommodating space 110; (2) installing a cooling core 20 in the accommodating space 110 and above the mounting opening 111; (3) installing an external circulation fan module 30 from the mounting opening 111 into the accommodating space 110; (4) covering the mounting opening 111 by combining the chassis 10 with a cover plate 40.

In one embodiment, Step (3) includes Step (3-1): the external circulation fan module 30 is installed slantingly from the mounting opening 111, wherein the external circulation fan module 30 has a fan frame 60. Besides, the fan frame 60 has at least one flap 61 perpendicularly extended from the fan frame 60 towards the cover plate 40 and each flap 61 has a locking hole 610. The flap 61 is L-shaped, and a locking hole 610 is configured on a plane. After Step (3-1) is performed, the Step (3) further includes Step (3-2):

changing from an aslant situation into a horizontal situation, and fixing the fan frame 60 in the chassis 10 under the cooling core 20.

In Step (4), more specifically, the cover plate 40 has a plurality of holes and at least one fixing plate 42 corresponding to the fan frame 60, and preferably each fixing plate 42 has a through hole 420. The fixing plate 42 is extended vertically from the cover plate 40 towards the fan frame 60, and a section of the fixing plate 42 is L-shaped, and the through hole 420 is configured on a plane. A locking element 70 is passed and installed to the through hole 420 and combined with the gasket 71.

The assembling method further includes Step (5): passing a hand tool through one of the holes into the accommodating space to lock the cover plate onto the chassis. More specifically, passing a tip of hand tool 2, such as a screwdriver, through one of the holes 41 of the cover plate 40 into the accommodating space 110 to lock the locking element 70 within the locking hole 610 of the fan frame 60 so as to complete the mounting process.

While this disclosure has been described by means of specific embodiments, numerous modifications and variations could be made thereto by those skilled in the art without departing from the scope and spirit of this disclosure set forth in the claims.

What is claimed is:

1. A heat exchanger, comprising:
    a chassis enclosing an accommodating space and having a mounting opening at a bottom of the accommodating space, and an outer outlet at a lateral of the accommodating space;
    a cooling core installed in the accommodating space and disposed above the mounting opening;
    an external circulation fan module installed into the accommodating space from the mounting opening and disposed between the outer outlet and the mounting opening; and
    a cover plate having a plurality of holes and configured to cover the mounting opening and combine with the chassis;
    wherein,
        outside air enters from the holes into the accommodating space and flows through the cooling core, and then exchanges heat with the cooling core, and flows out from the outer outlet,
        the external circulation fan module includes an axial fan and a fan frame, the external circulation fan module is fixed within the chassis by the fan frame, and the cover plate is locked onto the fan frame to integrate with the chassis, and
        the fan frame has at least one flap, and the flap perpendicularly extends from the fan frame toward the cover plate and has a locking hole.

2. The heat exchanger according to claim 1, wherein the chassis has an inner side facing an internal environment and an outer side facing an external environment, and an inner inlet and an inner outlet are formed on the inner side of the chassis, and the outer outlet and the mounting opening are formed on the outer side of the chassis.

3. The heat exchanger according to claim 2, further comprising an internal circulation fan installed in the chassis, configured to be corresponding to the external circulation fan module, and disposed on a top side of the accommodating space.

4. The heat exchanger according to claim 1, wherein the cover plate has at least one fixing plate extending perpendicularly from the cover plate towards the fan frame and having a through hole.

5. The heat exchanger according to claim 4, further comprising at least one locking element passed and installed to the through hole and fixed to the locking hole of the flap.

6. The heat exchanger according to claim 5, further comprising a gasket clamped between the flap and the fixing plate.

7. The heat exchanger according to claim 5, wherein one of the holes is corresponding to the through hole and is allowed for passing a hand tool.

8. The heat exchanger according to claim 4, wherein the flap and the fixing plate are L-shaped and secure with each other.

9. A machine cabinet, comprising:
    a cabinet, having an opening formed on a sidewall of the cabinet; and
    a heat exchanger, installed to the opening, and comprising:
        a chassis enclosing an accommodating space and having an inner side facing an internal environment of the cabinet, having an outer side facing an external environment of the cabinet, and having an outer outlet and a mounting opening respectively disposed on the outer side;
        a cooling core installed in the accommodating space, and disposed above the mounting opening and beside the outer outlet;
        an external circulation fan module installed from the mounting opening into the accommodating space, and disposed between the outer outlet and the mounting opening; and
        a cover plate having a plurality of holes and configured to cover the mounting opening and combine with the chassis;
    wherein,
        outside air enters from the holes into the external circulation fan module, and flows through the cooling core, and exchanges heat with the cooling core, and then flows out from the outer outlet,
        the external circulation fan module includes an axial fan and a fan frame, the external circulation fan module is fixed within the chassis by the fan frame, and the cover plate is locked onto the fan frame to integrate with the chassis, and
        the fan frame has at least one flap, and the flap perpendicularly extends from the fan frame toward the cover plate and has a locking hole.

* * * * *